(12) United States Patent
Cassagnes et al.

(10) Patent No.: US 10,983,141 B2
(45) Date of Patent: Apr. 20, 2021

(54) EXCITATION CIRCUIT, SYSTEM INCLUDING EXCITATION CIRCUIT AND CAPACITIVE TRANSDUCER, AND METHOD

(71) Applicant: NXP USA, Inc., Austin, TX (US)

(72) Inventors: Thierry Dominique Yves Cassagnes, Tournefeuille (FR); Joel Cameron Beckwith, Tokyo (JP); Jerome Romain Enjalbert, Tournefeuille (FR); Jalal Ouaddah, Labastidette (FR)

(73) Assignee: NXP USA, Inc., Austin, TX (US)

( * ) Notice: Subject to any disclaimer, the term of this patent is extended or adjusted under 35 U.S.C. 154(b) by 475 days.

(21) Appl. No.: 15/951,514

(22) Filed: Apr. 12, 2018

(65) Prior Publication Data

US 2018/0335444 A1    Nov. 22, 2018

(30) Foreign Application Priority Data

May 19, 2017    (EP) ..................................... 17305585

(51) Int. Cl.
*G01R 27/26*    (2006.01)
*G01P 15/125*    (2006.01)
*G01P 21/00*    (2006.01)
*H03F 1/26*    (2006.01)
(Continued)

(52) U.S. Cl.
CPC ............ *G01P 15/125* (2013.01); *G01P 21/00* (2013.01); *H03F 1/26* (2013.01); *H03G 1/0088* (2013.01); *B81B 2201/0235* (2013.01); *G01P 2015/0862* (2013.01)

(58) Field of Classification Search
USPC .................. 324/679, 691, 686; 381/111, 174
See application file for complete search history.

(56) References Cited

U.S. PATENT DOCUMENTS

| | | | |
|---|---|---|---|
| 2010/0166228 A1 | 7/2010 | Steele et al. | |
| 2010/0242603 A1* | 9/2010 | Miller | G01P 15/125 73/514.32 |
| 2011/0018616 A1 | 1/2011 | Li et al. | |

(Continued)

FOREIGN PATENT DOCUMENTS

| | | |
|---|---|---|
| CN | 104833823 A | 8/2015 |
| GB | 2459864 | 11/2009 |

(Continued)

*Primary Examiner* — Vincent Q Nguyen
(74) *Attorney, Agent, or Firm* — Charlene R. Jacobsen (57) ABSTRACT

A system includes a capacitive transducer, an excitation circuit, and a measuring circuit. The excitation circuit is configured to excite the capacitive transducer and the measuring circuit measures an output signal from the capacitive transducer responsive to the excitation voltage. The excitation circuit includes a voltage source for providing a first voltage in response to receipt of a supply voltage, a voltage generator coupled to the voltage source for receiving the first voltage and generating a second voltage that is greater than the supply voltage, and a control circuit coupled to the voltage source and the voltage generator. The control circuit is configured to provide any of a system ground, the first voltage, and the second voltage to first and second terminals of the capacitive transducer, and particularly, being configured to apply the system ground and the second voltage in the form of two consecutive stimuli with opposite polarities.

15 Claims, 7 Drawing Sheets

(51) Int. Cl.
*H03G 1/00* (2006.01)
*G01P 15/08* (2006.01)

(56) References Cited

U.S. PATENT DOCUMENTS

| | | |
|---|---|---|
| 2014/0144230 A1 | 5/2014 | Magnoni et al. |
| 2014/0165691 A1 | 6/2014 | Stewart |
| 2014/0270262 A1* | 9/2014 | Zeleznik ................. B81B 7/008 |
| | | 381/114 |
| 2014/0352400 A1 | 12/2014 | Barrilado et al. |
| 2015/0096377 A1 | 4/2015 | Membretti et al. |
| 2015/0181352 A1* | 6/2015 | Astgimath ............... H04R 3/00 |
| | | 381/174 |
| 2015/0276407 A1* | 10/2015 | Bhandari ........... G01C 19/5776 |
| | | 73/504.12 |
| 2015/0318829 A1 | 11/2015 | Astgimath |
| 2016/0103174 A1 | 4/2016 | Aaltonen et al. |
| 2016/0274141 A1 | 9/2016 | Enjalbert |

FOREIGN PATENT DOCUMENTS

| | | |
|---|---|---|
| WO | WO-97/41447 A1 | 11/1997 |
| WO | WO-2008/091730 A1 | 7/2008 |
| WO | WO-2012/129011 A1 | 9/2012 |

\* cited by examiner

EXCITATION CIRCUIT, SYSTEM INCLUDING EXCITATION CIRCUIT AND CAPACITIVE TRANSDUCER, AND METHOD

CROSS-REFERENCE TO RELATED APPLICATIONS

This application claims the priority under 35 U.S.C. § 119 of European patent application no. 17305585.6, filed May 19, 2017 the contents of which are incorporated by reference herein.

TECHNICAL FIELD OF THE INVENTION

The present invention relates generally to the field of microelectromechanical systems (MEMS) transducer devices. More specifically, the present invention relates to a high voltage excitation circuit to produce a double differential excitation signal for a capacitive transducer.

BACKGROUND OF THE INVENTION

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of MEMS transducers. Microelectromechanical systems (MEMS) transducers, such as capacitive sensor devices, are used in consumer electronics in a wide range of applications, such as gaming, augmented reality, navigation, and the like. Since these consumer devices are often battery powered, a challenge for developers of such capacitive transducers is to find an optimal noise versus power trade-off for such devices.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

The various embodiments described herein can provide an apparatus, system, and methodology for producing a fully differential excitation voltage for a capacitive transducer, such as a microelectromechanical systems (MEMS) capacitive accelerometer. More particularly, an apparatus, in the form of an excitation circuit, is implemented that includes at least one charge pump for producing an excitation signal that is greater than a supply voltage. The excitation voltage is applied to the capacitive transducer in the form of two consecutive stimuli with opposite polarities (i.e., a double differential excitation signal). Such an excitation signal allows for the cancellation of offsets and flicker noise from the analog circuitry while concurrently increasing the sensitivity of the capacitance sensing system. Accordingly, signal-to-noise ratio (SNR) performance of the system may be dramatically improved at modest cost in terms of die size and power. The description provided below relates to a capacitive transducer in the form of a MEMS capacitive accelerometer. It should be appreciated, however, that embodiments described below may be generalized to other capacitive transducers, circuits, and components, such as microphones, gyroscopes, and so forth.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions.

Figure 1:
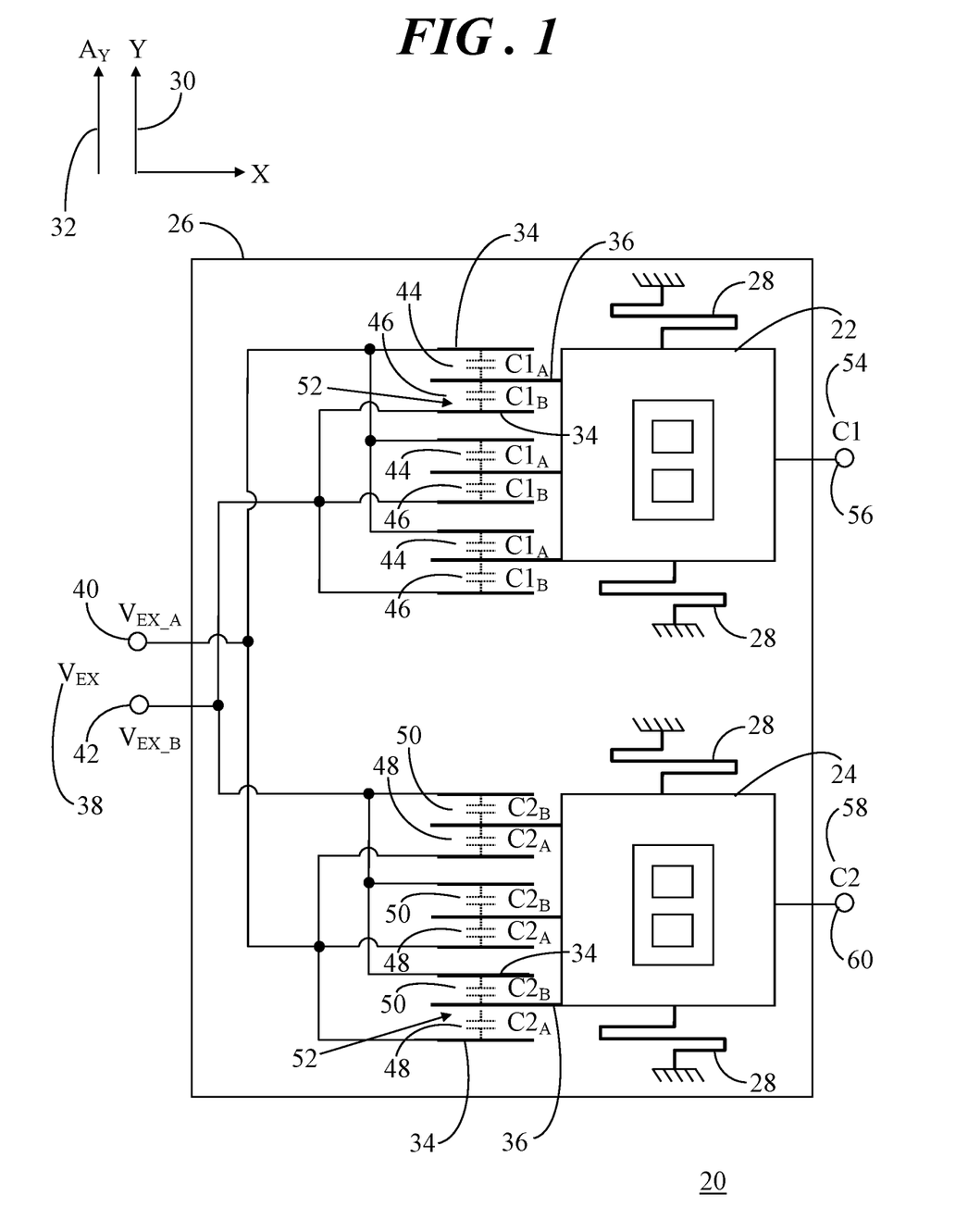
FIG. 1 shows in a simplified and representative form a top view of a microelectromechanical systems (MEMS) capacitive transducer.

Referring now to FIG. 1, FIG. 1 shows in a simplified and representative form a top view of a microelectromechanical systems (MEMS) capacitive transducer 20. In this example, capacitive transducer 20 is a MEMS capacitive accelerometer. As such, capacitive transducer 20 may alternatively be referred to herein as accelerometer 20.

Accelerometer 20 generally includes a first movable mass 22 and a second movable mass 24 spaced apart from and movably coupled to a substrate 26 through spring elements 28. In this example, spring elements 28 enable translational motion of first and second movable masses 22, 24 in a direction substantially parallel to a Y-axis 30 in a three-dimensional coordinate system. That is, spring elements 28 enable translational motion of first and second movable masses 22, 24 in response to an acceleration force 32, labeled $A_Y$, imposed on accelerometer in a direction that is substantially parallel to Y-axis 30.

The translational motion of first and second movable masses 22, 24 in response to acceleration force 32 can be detected as a change in capacitance between certain electrodes. By way of example, accelerometer 20 includes fixed electrodes 34 mechanically coupled to, but electrically isolated from, substrate 26. Movable electrodes 36 are coupled to first and second movable masses 22, 24 and are positioned in alternating arrangement with fixed electrodes 34. In a structure of this type, charge is injected into accelerometer 20 through a differential excitation voltage 38, labeled $V_{EX}$, applied between a first and second terminals 40, 42 of accelerometer 20. In this illustration, first terminal 40 is labeled $V_{EX\_A}$ and second terminal is labeled $V_{EX\_B}$. Excitation voltage 38 is the magnitude of the voltage, i.e., the voltage difference between the minimum and maximum voltages connected to first and second terminals 40, 42. The first terminal 40 receives a voltage step relative to a common mode voltage and second terminal receives a voltage step relative to the common mode voltage. In such systems, the common mode voltage is typically half of the voltage between the minimum and maximum voltages (i.e., half of the excitation voltage) that will be connected to first and second terminals 40, 42 will be connected to. Further, first and second movable masses 22, 24 are also connected to the common mode voltage. Thus, first and second movable masses 22, 24 can be at the same voltage as first and second terminals 40, 42 when an excitation measurement is not occurring.

Parallel-plate capacitors 44, 46, 48, 50 are effectively formed between fixed and movable electrodes 34, 36. That is, fixed and movable electrodes 34, 36 represent the parallel plates and capacitor gaps 52 are thus formed between them. Excitation voltage 38 applied to accelerometer 20 charges capacitors 44, 46, 48, 50, and this charge can be collected in downstream circuitry (discussed below). More particularly, a voltage step may be applied via first terminal 40 to charge capacitors 44, 48 and a voltage step may applied via second terminal 42 to charge capacitors 46, 50.

When first and second movable masses 22, 24 move in response to acceleration force 32, the width of capacitor gaps 52 change which in turn causes the capacitances (labeled $C1_A$, $C1_B$, $C2_A$, $C2_B$, respectively) of capacitors 44, 46, 48, 50 to change. First and second movable masses 22, 24 move commensurate with the magnitude of acceleration force 32, such that the larger the magnitude of acceleration force 32, the more first and second movable masses 22, 24 will move toward an extreme position and the larger the differential charge output from accelerometer 20 will be. By way of example, a first capacitance 54 at a first output node 56 of accelerometer 20 is produced as a difference between capacitances $C1_A$, $C1_B$ of capacitors 44, 46 associated with first movable mass 22. That is, first output node 56 connects to both capacitances $C1_A$, $C1_B$ and under excitation by excitation voltage 38, the difference between capacitances $C1_A$, $C1_B$ produces a differential charge at first output node 56. Similarly, a second capacitance 58 at a second output node 60 of accelerometer 20 is produced as a difference between capacitances $C2_A$, $C2_B$ of capacitors 48, 50 associated with second movable mass 24. That is, second output node 60 connects to both capacitances $C2_A$, $C2_B$ and under excitation by excitation voltage 38, the difference between capacitances $C2_A$, $C2_B$ produces a differential charge at second output node 60. Thus, the net maximum capacitive change, or the sensitivity, of accelerometer 20 can be represented as follows:

$$C1 = C1_A - C1_B \quad (1)$$

$$C2 = C2_A - C2_B \quad (2)$$

$$C_S = C1 - C2 \quad (3)$$

In the above equations, $C_S$ represents the total differential capacitive change of accelerometer 20 at full scale. Thus, $C_S$ represents the sensitivity of accelerometer 20. In an example, a full scale differential capacitive change for capacitive accelerometer 20 may be approximately 72 fF ($72 \times 10^{-15}$ Farad). As will be discussed in significantly greater detail below, accelerometer 20 is provided with electronic circuitry which converts these capacitive changes (e.g., C1 and C2) to signals indicative of acceleration force 32 parallel to Y-axis 30.

Capacitive accelerometer 20 is provided for illustrative purposes herein. It should be understood that one or more movable masses of a capacitive transducer can encompass a great variety of shapes and configurations capable of single or multiple axis sensing. Further, only a few fixed and movable electrodes are shown for simplicity of illustration. Those skilled in the art will recognize that the quantity and/or configuration of the fixed and movable electrodes can vary in accordance with a particular design. Indeed, although the fixed and movable electrodes are represented as being external to the movable masses for simplicity of illustration, a great variety of fixed and movable electrodes are internal to the movable masses so as to be more robust in terms of package stress and impact shock. Still further, although a capacitive accelerometer 20 is discussed herein, embodiments described below may be generalized to other capacitive transducers, circuits, and components, such as microphones, gyroscopes, and so forth.

Figure 2:
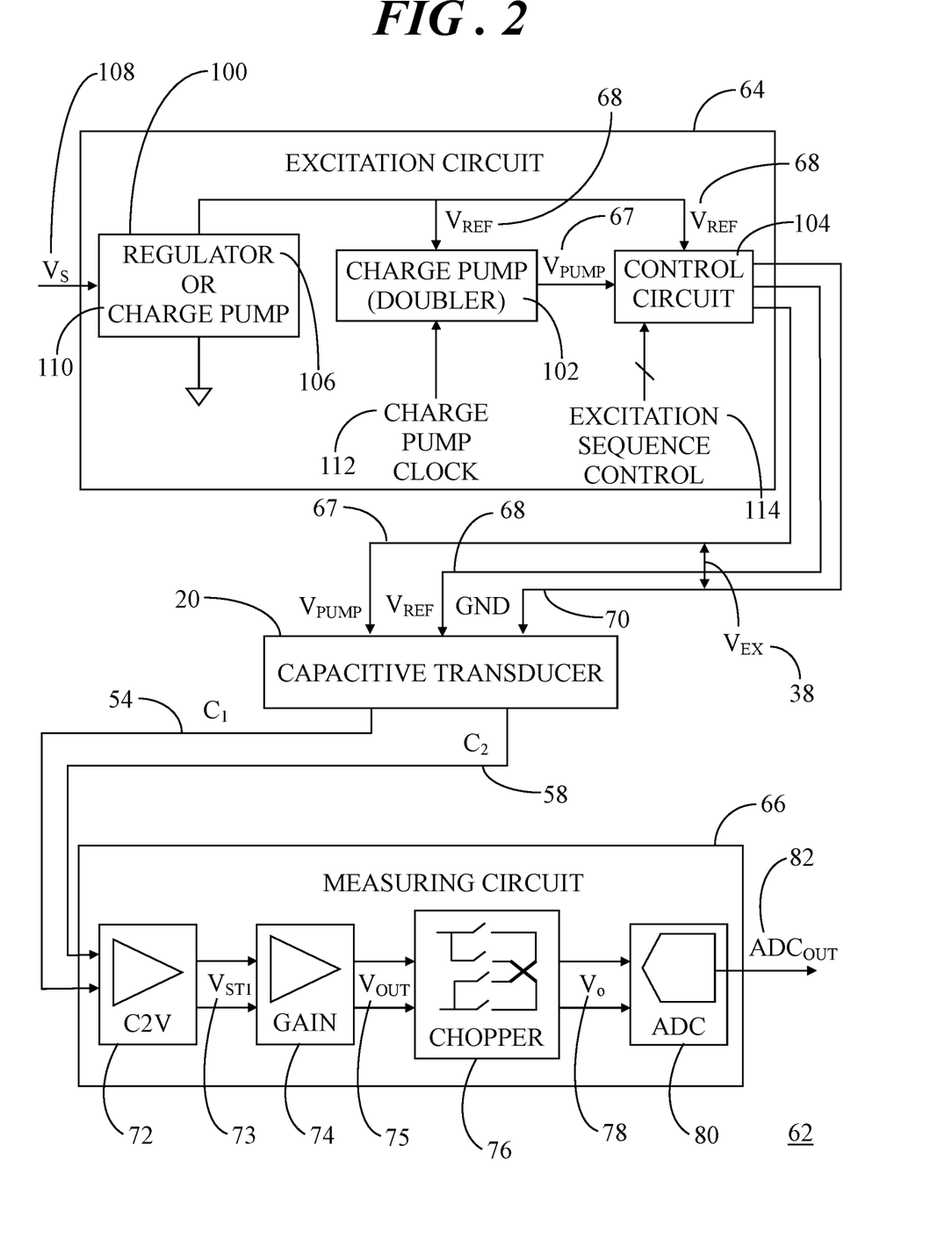
FIG. 2 shows a block diagram of an embodiment of a system that may include the MEMS capacitive transducer.

FIG. 2 shows a block diagram of an embodiment of a system 62 that includes a MEMS capacitive transducer. In this embodiment, the MEMS capacitive transducer may be capacitive accelerometer 20 of FIG. 1. However, in alternative embodiments, a wide variety of capacitive transducers may be implemented within system 62.

In this example, system 62 includes an excitation circuit 64 configured to excite accelerometer 20 and a measuring circuit 66 for measuring results from the excitation. Excitation circuit 64 and accelerometer 20 are electrically coupled to convey a charge pump voltage 67, $V_{PUMP}$, a reference voltage 68, and a system ground 70 from excitation circuit 64 to accelerometer 20. As will be discussed in significantly greater detail below, excitation voltage 38 is the differential voltage between charge pump voltage 67 and system ground 70, as denoted in FIG. 2 by the bidirectional arrow between the interconnects representing charge pump voltage 67 and system ground 70. Additionally, accelerometer 20 and measuring circuit 66 are electrically coupled to convey the excitation results, e.g., first capacitance 54 (as a first differential charge component) and second capacitance 58 (as a second differential charge component), from accelerometer 20 to measuring circuit 66.

Measuring circuit 66 generally includes a signal chain used to process first and second capacitances 54, 58 from accelerometer 20 to yield a signal representative of acceleration force 32 (FIG. 1). A first stage of the signal chain includes a capacitance-to-voltage converter stage 72, abbreviated C2V herein, which receives first and second capacitances 54, 58 from accelerometer 20 and converts them to a first stage analog output voltage 73, $V_{ST1}$. A second stage of the signal chain is a gain stage 74, GAIN, connected to an output of C2V 72. Gain stage 74 receives first stage analog output voltage 73 and amplifies it to produce a second stage analog output voltage 75, $V_{OUT}$. Gain stage 74 is followed by a chopper circuit 76, CHOPPER, which yields an analog output voltage 78, $V_O$. Analog-to-digital converter 80, ADC, follows chopper circuit 76. ADC 80 converts analog output voltage 78 into a digital code 82, $ADC_{OUT}$, indicative of acceleration force 32.

Figure 3:
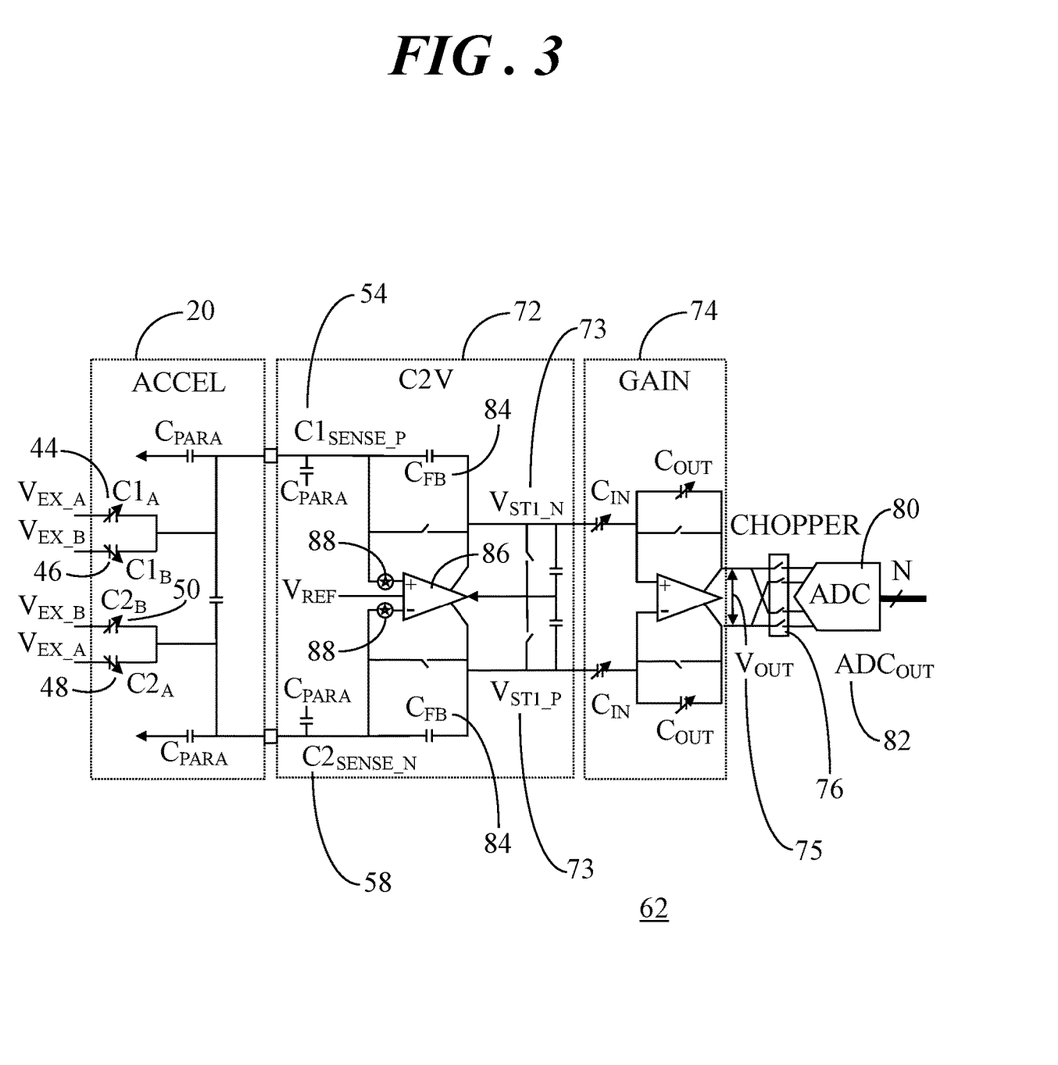
FIG. 3 shows a circuit diagram of a portion of the system of FIG. 2.

Now referring concurrently to FIGS. 2 and 3, FIG. 3 shows a circuit diagram of a portion of system 62. The circuit diagram of FIG. 3 includes a transducer, e.g., accelerometer 20, C2V stage 72, gain stage 74, chopper circuit 76, and ADC 80.

As mentioned previously, an excitation voltage is generated by an excitation voltage source. The excitation voltage will charge the various capacitors 44, 46, 48, 50 of accelerometer 20 and will cause a differential charge to be collected inside feedback capacitors 84, $C_{FB}$, of C2V 72. A maximum voltage value, $V_{ST1}$, that will be found at the output of C2V 72 can be estimated as follows:

$$V_{ST1} = \frac{C_S}{C_{FB}} V_{EX} \tag{4}$$

Using equation (4), it can be seen that the transfer function from $V_{EX}$ to $V_{ST1}$ is $C_S/C_{FB}$. In a prior art example, $V_{EX}$ is 0.8 V, $C_s$ is approximately 72 fF, and the combined maximum capacitive charge of the two feedback capacitors 84, $C_{FB}$, of C2V 72 is approximately 600 Ff. Using equation (4), $V_{ST1}$=(72/600)0.8=0.096 V. Further, the transfer function $C_S/C_{FB}$ is approximately 72/600=0.12.

Analysis of the noise transfer function of the prior art example that does not include excitation circuit 64 reveals that the primary sources of noise are an operational amplifier 86 of C2V 72 and the voltage supply regulator that receives an external source voltage and generates the excitation voltage. There may be other sources of noise, such as Brownian noise (equivalent to electrical thermal noise) due to gas molecules trapped within the cavity of the accelerometer and the shock against the moving mass. However, these other sources of noise may be negligible versus the electrical noise generated by amplifier 86 of C2V 72 and an excitation buffer of the supply voltage regulator.

With reference to the noise transfer function from the excitation buffer of the supply voltage regulator, since the excitation buffer injects the excitation voltage into accelerometer 20, the noise that it injects additionally goes through the same transfer function to the output of C2V 72 (i.e., $C_S/C_{FB}$ which in this prior art example may be approximately 0.12).

Now analyzing the noise from operational amplifier 86 of C2V 72, the overall noise generated by operational amplifier 86 is represented by noise sources 88 placed at the inputs of operational amplifier 86, each of which is represented with a star on FIG. 3. Each noise source 88 has an amplitude of one half of the input referred noise, $V_N/2$, with opposite signs. The input referred noise, (e.g., noise sources 88) gets transferred and amplified at the output of operational amplifier 86. That is, a change in voltage at the input of operational amplifier 86 will create a change in charge stored in the input capacitors. The input capacitors include all capacitors tied to the inputs of operational amplifier 86, most of which are parasitic capacitors, $C_{PARA}$. Since the inputs of operational amplifier 86 are very high impedance, typically made of metal-oxide-semiconductor (MOS) gates, all current flow caused by a change in charge of the input capacitors will cause the same change in charge of feedback capacitors 84. Thus, a noise voltage at the output of C2V 72, $V_{NOISE\_OUT}$, can be represented by the following equation:

$$V_{NOISE\_OUT} = \left(\frac{C_{PARA\_TOT}}{C_{FB}} + 1\right) V_N \tag{5}$$

In equation (5), $C_{PARA\_TOT}$ is the total parasitic capacitance, $C_{FB}$ is the feedback capacitance of feedback capacitors 84, and $V_N$ is the noise at the inputs of operational amplifier 86. With typical parasitic capacitor values, the noise generated by C2V 72 can get amplified by a factor of 6, i.e., $C_{PARA\_OUT}/C_{FB}+1=6$. Using this same example, the ratio of the two noise factors 6/0.12=50. This ratio indicates that the noise from C2V 72 gets amplified fifty times more than noise from the excitation buffer. Considering for the sake of low power design, that the excitation buffer and C2V 72 are designed with bias currents of the same range, the above equations reveal that to optimize the signal to noise ratio (SNR) of system 62, the largest possible excitation voltage should be used.

Now with regard to the remaining components in the signal chain of measuring circuit 66, the second gain stage 74 enables trimming of the full scale voltage level that is to be sampled by ADC 80. Typically, the target full scale voltage level should be equal to 1V, so that for example, in a 16 g acceleration sensing mode, acceleration force 32 (FIG. 1) equal to 16 g will produce a 1V dc level at the input of ADC 80. The gain of gain stage 74 may be set using a gain control bus. As shown in FIG. 3, the gain, G, of gain stage 74 is given by the following equation:

$$G = \frac{C_{IN}}{C_{OUT}} \tag{6}$$

In equation (6), $C_{IN}$ represents the input capacitance from the input to the amplifier summing nodes of gain stage 74, and $C_{OUT}$ represents the feedback capacitance from the amplifier output summing nodes of gain stage 74. A gain control bus allows for selection of the input and output capacitor bank values that will set the gain at gain stage 74 at the value that produces a full scale value of, for example, 1V. This trimming at gain stage 74 may be performed for each capacitive transducer at final test.

Now considering the output of gain stage 74, the following equations can be derived for both analog output signal, $V_{OUT}$, and for the noise, $V_{NOISE\_OUT}$, as follows:

$$V_{OUT} = V_{EX}\left(\frac{C_S}{C_{FB}}\right)\left(\frac{C_{IN}}{C_{OUT}}\right) \tag{7}$$

$$V_{NOISE\_OUT} = \left(\frac{C_{PARA\_OUT}}{C_{FB}} + 1\right) V_N \left(\frac{C_{IN}}{C_{OUT}}\right) \tag{8}$$

Equations (7) and (8) provide insight as to what happens when the excitation voltage, $V_{EX}$, increases. As the excitation voltage increases, the signal coming out of accelerometer 20 increases and the $C_{IN}/C_{OUT}$ ratio that sets the second gain stage 74 may be reduced to main the same full scale voltage level, e.g., 1V. The direct consequence of this is that the noise coming from C2V stage 72 will be reduced by an equivalent amount. The noise coming from the excitation buffer of the voltage supply regulator should increase together with the excitation voltage, $V_{EX}$, making the noise contribution of the excitation voltage identical. Given the equations presented above, the complete equation for the SNR at the input of ADC 80 is as follows:

$$\frac{SIGNAL}{NOISE} = \tag{9}$$

$$SNR = \frac{V_{EX}\left(\frac{C_S}{C_{FB}}\right)\left(\frac{C_{IN}}{C_{OUT}}\right)}{\left(\frac{C_{PARA\_TOT}}{C_{FB}} + 1\right) V_N \left(\frac{C_{IN}}{C_{OUT}}\right)} = \frac{V_{EX} C_S}{(C_{PARA\_TOT} + C_{FB}) V_N}$$

As can be seen from equation (9) increasing the excitation voltage, $V_{EX}$, proportionally improves the signal to noise ratio, SNR. That is, an increase in the excitation voltage enables a reduction in the gain of the second gain stage 74 ($C_{IN}/C_{OUT}$), which results in a higher SNR.

Figure 4:
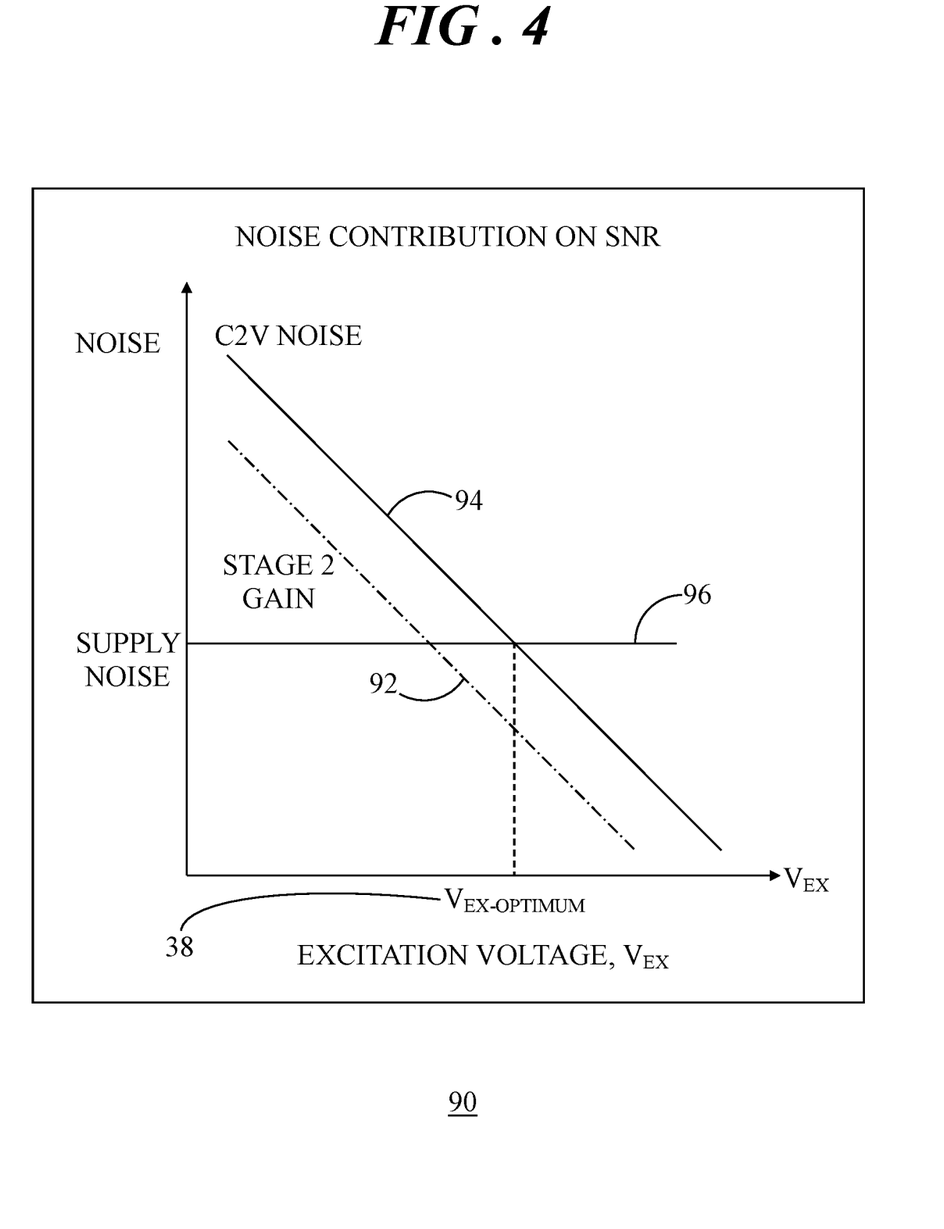
FIG. 4 shows a graph exemplifying noise contributions to the signal-to-noise ratio (SNR) of an output signal from the system of FIG. 2 versus an excitation voltage.

FIG. 4 shows a graph 90 exemplifying a noise contribution to the signal to noise ratio (SNR) of an output signal from the system of FIG. 2 versus an excitation voltage. Chart 90 has a horizontal axis representing increasing values of excitation voltage, $V_{EX}$, and a vertical axis representing noise on the signal. Thus, chart 90 provides a visual representation of the effect that an increase in excitation voltage has on the noise contribution of C2V stage 72 (FIG. 2) and on the noise contribution from an excitation voltage source.

In graph 90, a dash-dot line 92 represents the programmed gain of gain stage 74. Thus, as excitation voltage increases, the programmed gain 92 of gain stage 74 can be reduced. A noise contribution on SNR from C2V stage 72 is represented by a solid line 94. As a consequence of the reduced programmed gain 92 of gain stage 74, noise contribution 94 on SNR from C2V stage 72 is also reduced. As the magnitude of the excitation voltage increases, the associated noise contribution also increases by the same amount. However, the equivalent reduction in gain of gain stage 74 will result in a constant noise contribution of the excitation voltage, as represented by a horizontal solid line 96. In accordance with an embodiment, an optimal value of excitation voltage 38, $V_{EX-OPTIMUM}$, is reached when the noise contribution 94 of C2V stage 72 intersects the noise contribution 96 of the excitation voltage source. That is, the optimal excitation voltage 38 is configured to be a value at which noise contribution 96 of the excitation voltage source is approximately equivalent to noise contribution 94 from C2V stage.

Now referring back to FIGS. 2 and 3, in the analog signal chain that includes C2V stage 72 and gain stage 74, signal errors known as DC offset and flicker noise (1/f noise) can be generated. At chopper circuit 76, two output signal pulses of opposite signs, corresponding to two excitations of capacitive accelerometer 20 in opposing polarities, are sampled and the sign of the second sample is swapped to have the same sign as the first sample. The DC offset and flicker noise, (i.e., signal error labeled $V_{ERROR}$) is the same for both pulses. Thus, as the sign of the second sample is swapped, the signal error will have the opposite sign. Addition of the two output signal samples at chopper 76 results in an accurate read-out from measuring circuit 66, as represented by the following equation:

$$V_O = V_{OUT1} + V_{ERROR} + V_{OUT2} + V_{ERROR} = V_{OUT1} + V_{OUT2} \quad (10)$$

In equation (10), $V_O$ represents the analog output signal from chopper 76, $V_{OUT1}$ represents the first signal output sample, $V_{OUT2}$, represent the second signal output sample in which its sign is swapped, and $V_{ERROR}$ represents the low frequency DC offset and flicker noise. Equation (10) reveals that as both samples are added together at chopper 76 to yield $V_O$, the signal error (e.g., DC offset and flicker noise) generally cancels. Cancellation of the signal error (DC offset and flicker noise) occurs conditionally between the point where the signal was modulated and where the signal was demodulated. The acceleration signal is modulated at the excitation signal 38 and demodulated at chopper 76. The acceleration signal is being measured twice, both times with two inversions (at excitation voltage 38 and chopper 76). Although, the signal error is also being measured twice, it only undergoes a single inversion. Thus, summation of the two samples results in the outcome expressed in equation (10).

With continued reference to FIGS. 2 and 3 and in accordance with an embodiment, excitation circuit 64 is implemented to provide an excitation voltage commensurate with the above noise analysis and chopper 76 is implemented to enable the cancellation of signal error imposed on the output signal by the analog circuitry of measuring circuit 66.

Excitation circuit 64 for a capacitive transducer, such as accelerometer 20, includes a voltage source 100, a voltage generator 102 coupled to voltage source 100, and a control circuit 104 connected to voltage source 100 and voltage generator 102. From the analysis provided above, the optimal excitation voltage 38 (FIG. 4) may be significantly higher than the supply voltage of system 62, especially for low voltage, low power systems. Accordingly, excitation circuit 64 is provided to generate an excitation voltage at a level that gives the highest possible signal to noise ratio.

In an embodiment, voltage source 100 may be a voltage regulator 106 configured to receive a supply voltage 108, $V_S$, from an external power source, such as a battery. Voltage regulator 106 is further configured to produce a constant output level of a first voltage (i.e., a reference voltage 68, $V_{REF}$) from supply voltage 108, a value of which is no greater than supply voltage 108. In another embodiment, voltage source 100 may be a charge pump 110 configured to receive supply voltage 108 and produce reference voltage 68, a value of which is greater than supply voltage 108.

Voltage generator 102 is configured to receive reference voltage 68 and output a second voltage. Voltage generator 102 may be a charge pump configured to generate the second voltage in accordance with a charge pump clock 112. A charge pump is a circuit that typically utilizes capacitors in series to increase the DC source voltage as needed. Thus, in an embodiment, voltage generator 102 generates the second voltage (i.e., charge pump voltage 67) to be a value that is greater than supply voltage 108. More particularly, an ideal charge pump may be a voltage doubler that effectively doubles the value of reference voltage 68 to yield charge pump voltage 67.

Control circuit 104 is configured to receive reference voltage 68 from voltage source 100 and to receive charge pump voltage 67 from voltage generator 102. Control circuit 104 is further configured to provide any of system ground 70, reference voltage 68, and charge pump voltage 67 to either of first and second terminals 40, 42 (FIG. 1) of the high impedance capacitive transducer (e.g., accelerometer 20). An excitation sequence control signal 114 manages timing of the provision of signals to first and second terminals 40, 42. In accordance with excitation sequence control signal 114, at a first instant in time, control circuit 104 is configured to provide charge pump voltage 67 to first terminal 40, while ground 70 is applied to second terminal 42. At a second instant in time following the first instant, control circuit 104 is configured to provide charge pump voltage 67 to second terminal 42, while ground 70 is applied to first terminal 40.

Accordingly, at the first instant in time, a positive excitation voltage step (one half of excitation voltage 38) is applied to capacitors 44, 50 (FIG. 1) and a negative excitation voltage step (the other half of excitation voltage 38) is applied to capacitors 46, 48 (FIG. 1). At the second instant in time, a positive excitation voltage step (one half of excitation voltage 38 is applied to capacitors 46, 48 and a negative excitation voltage step (the other half of excitation voltage 38 is applied to capacitors 44, 50. As such, excitation voltage 38 is applied to accelerometer 20 in the form of two consecutive stimuli (i.e., two pulses) with opposite polarities.

The positive and negative excitation voltage 38 applied to first and second terminals 40, 42, respectively, should be kept symmetrical relative to reference voltage 68 (i.e., the common mode voltage). That is, charge pump voltage 67 and system ground 70 are arranged on opposites sides of and equidistant from reference voltage 68. A capacitive transducer, such as accelerometer 20, produces a change in capacitance under the influence of acceleration force 32. However, such change in capacitance can also result from the electric fields generated inside accelerometer 20 by the different applied voltages. As such, the symmetrical arrangement of charge pump voltage 67 and system ground 70 relative to reference voltage 68 may mitigate adverse effects from the electric fields generated inside accelerometer 20.

Figure 5:
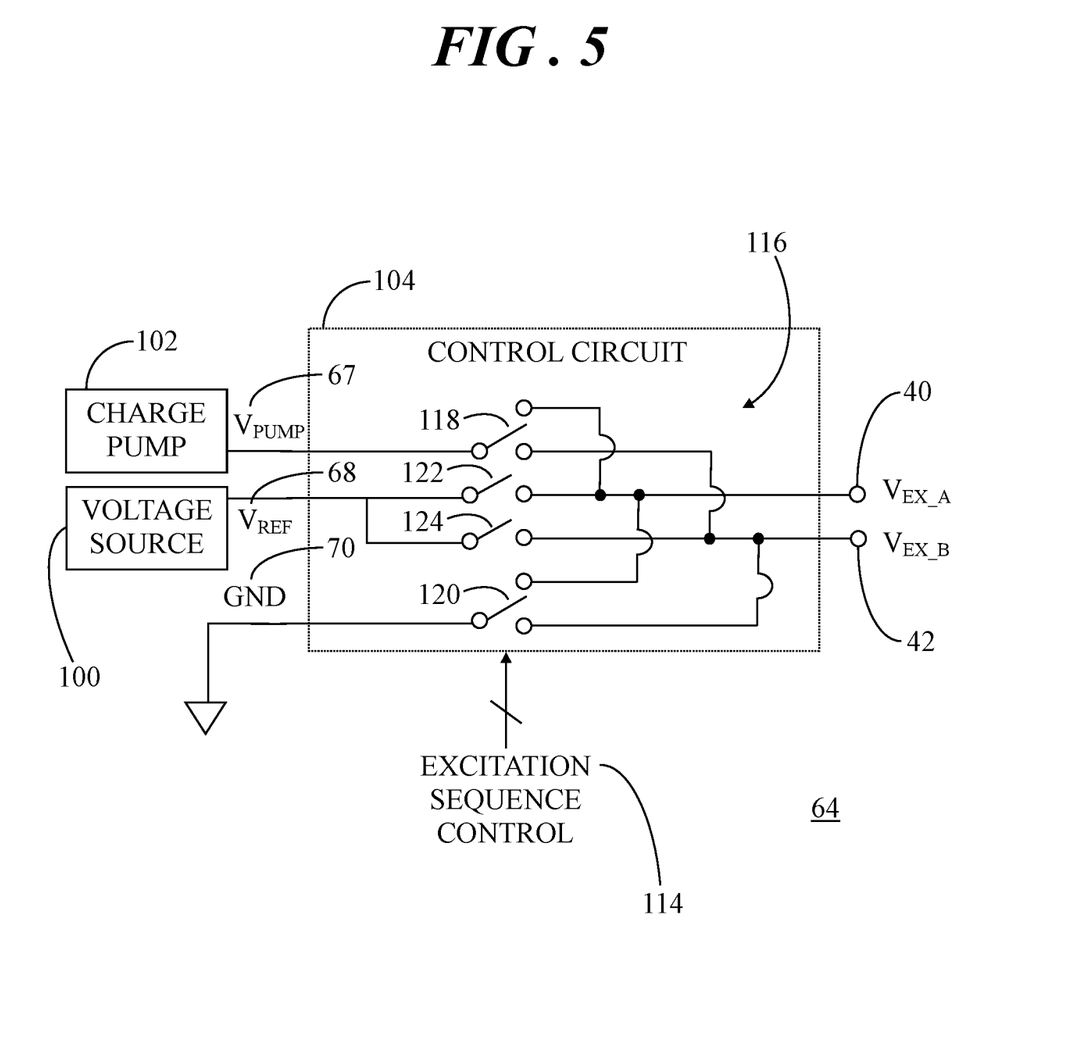
FIG. 5 shows in a simplified and representative form a switching feature of an excitation circuit of the system of FIG. 2.

FIG. 5 shows in a simplified and representative form a switching feature 116 of control circuit 104 of excitation circuit 64. Switching feature 116 is provided in highly simplified form to demonstrate that any of system ground 70, reference voltage 68, and charge pump voltage 67 may be provided to first and second terminals 40, 42 of a capacitive transducer, such as accelerometer 20 (FIG. 1) in accordance with a timing scheme provided by excitation sequence control 114.

As shown, a first switch element 118 enables charge pump voltage 67 produced by charge pump 102 to be applied to either of first and second terminals 40, 42 and a second switch element 120 enables system ground 70 to be applied to either of first and second terminals 40, 42. Third and fourth switch elements 122, 124 enable reference voltage 68 to be applied to first and second terminals 40, 42 separately and/or concurrently. Switch elements 118, 120, 122, 124 represent a wide variety of electrical components which can "make" or "break" an electrical circuit thereby providing any of charge pump voltage 67, reference voltage 68, and system ground 70 to first and second terminals 40, 42.

Figure 6:
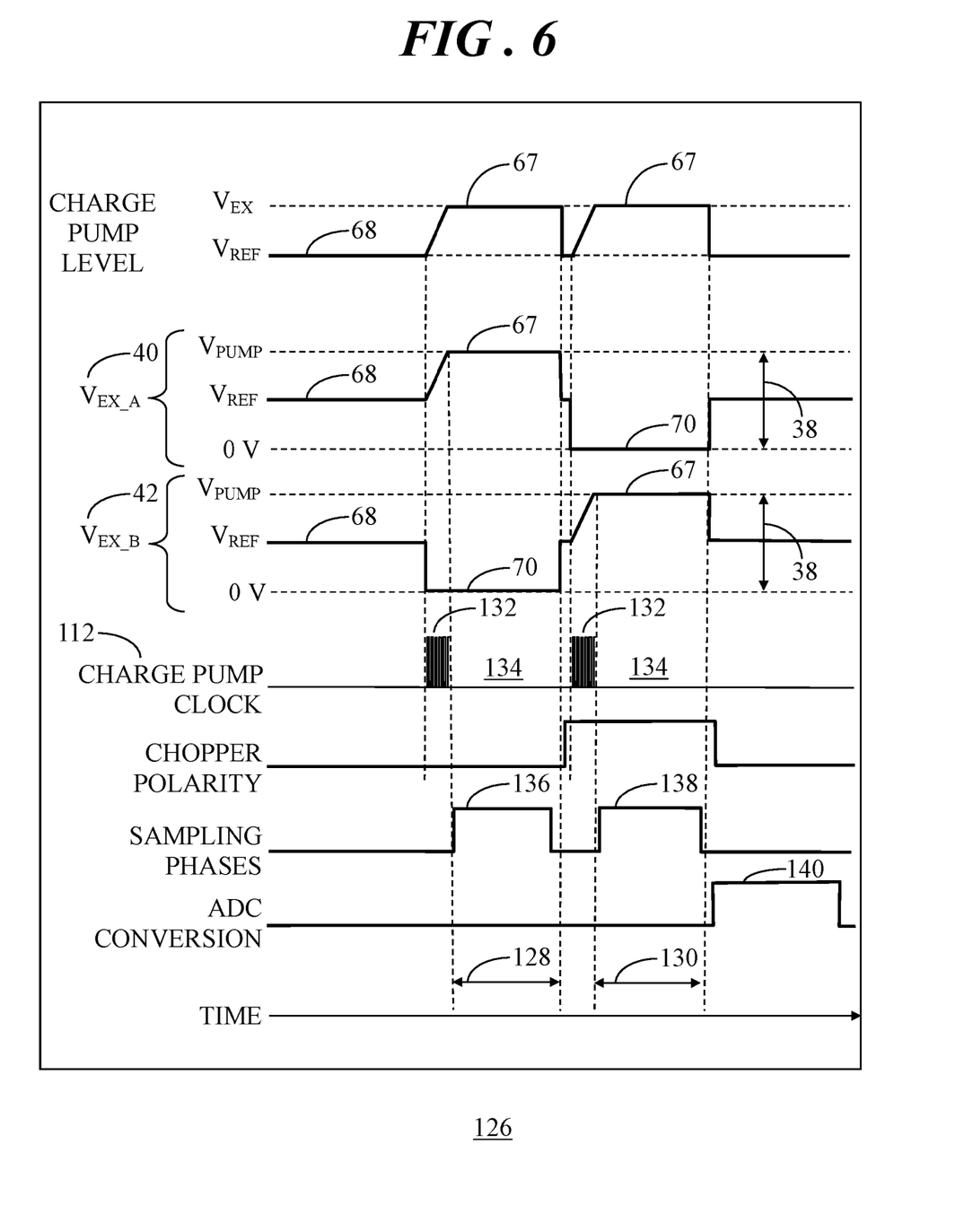
FIG. 6 shows a diagram exemplifying a signal sequence for the system of FIG. 2.

FIG. 6 shows a diagram 126 exemplifying a signal sequence for system 62 (FIG. 2). Diagram 126 represents one measurement cycle. Of course, a functioning system will include a multiplicity of measurement cycles. As mentioned above, voltage generator 102, as a charge pump, is implemented to enable boosting of excitation voltage 38 to whatever level yields the highest SNR. For a given reference voltage 68, $V_{REF}$, an optimal solution entails effectively building two voltages, namely system ground 70 (0 V) and charge pump voltage 67 (e.g., twice the reference voltage 68, $2*V_{REF}$). The differential voltage between system ground 70 and charge pump voltage 67 yields excitation voltage 38. However, in order to enable the implementation of chopper 76 (FIG. 2) in order to remove signal error (e.g., DC offset and flicker noise) imposed by the analog circuitry of measuring circuit 66, this high excitation voltage 38 is applied in the form of two consecutive stimuli, or pulses, with opposite polarities.

The horizontal axis of diagram 126 represents time. Charge pump 102 of excitation circuit 64 (FIG. 2) receives reference voltage 68 and in accordance with charge pump clock 112 (FIG. 2), charge pump 102 effectively doubles reference voltage 68 to produce charge pump voltage 67 that is greater than supply voltage 108 (FIG. 2). At a first instant 128 relative to time, charge pump clock 112 signals charge pump 102 to generate charge pump voltage 67. Subsequently, at a second instant 130 in time, charge pump clock 112 signals charge pump 102 to again generate charge pump voltage 67.

In general, a charge pump uses switching devices to control the connection of a voltage to an energy-storage capacitor. By way of example, a two-stage cycle can be used to generate a higher pulsed voltage from a lower-voltage supply. In a first stage 132 of the cycle, a charge pump typically operates in two alternating phases according to charge pump clock (e.g., charge pump clock 112). During a first half-period of the clock signal, a first capacitor (typically referred to as a flying capacitor) is charged between the supply voltage and ground. A second capacitor (typically referred to as a tank capacitor) is connected between the charge pump output and ground. During the second half-period of the clock signal, the flying capacitor is connected between the output and the supply voltage, thereby charging the tank capacitor to a higher voltage. After several clock periods during first stage 132, and if no load current is drawn from the tank capacitor, the voltage at the charge pump output converges to the higher voltage (e.g., twice the supply voltage). Thus, by the end of first stage 132, in some configurations, the supply voltage may be approximately doubled (ignoring leakage effects). At a second stage 134, this doubled voltage can be made available to accelerometer 20 as charge pump voltage 67. Since accelerometer 20 (FIG. 1) is purely a capacitive load for charge pump 102, charge pump clock 112 is only needed during first stage 132 until charge pump 102 reaches its target level, e.g., charge pump voltage 67. Then charge pump clock 112 can stop. The output level of charge pump 102 will stay at charge pump voltage 67 until another output level is needed. Thus, at each of first and second instants 128, 130, excitation voltage 38 is available to the load, e.g., accelerometer 20, as the differential voltage between system ground 70 and charge pump voltage 67. Since additional power consumption only occurs during first stage of the clocking cycles, system cost in terms of power consumption can be kept low. Further, by switching off charge pump 102 following first stage 132, potential corruption of the sampled the acceleration signal by switching noise can be avoided.

The resulting excitation pulses are shown in association with first terminal 40, $V_{EX\_A}$, and second terminal 42, $V_{EX\_B}$. During first instant 128, charge pump voltage 67 is applied to first terminal 40 while system ground 70 is applied to second terminal 42. Conversely, during second instant 130, charge pump voltage 67 is applied to second terminal 42 while system ground 70 is applied to first terminal 40. Thus, excitation voltage 38 (as the differential voltage between system ground 70 and charge pump voltage 67) is applied as two consecutive stimuli with opposite polarities. Under both scenarios, charge pump voltage 67 and system ground 70 are arranged on opposite sides of and equidistant from reference voltage 68 (i.e., the common mode voltage). In an embodiment implemented with charge pump 102, a charge pump voltage may be 3.2 V, a negative voltage may be 0 V, and a reference voltage may be 1.6 V. Reference voltage 68 is the voltage at which the system is stable and no measurements are performed.

Diagram 126 further illustrates a first sampling phase 136 associated with first instant 128 and a second sampling phase 138 associated with second instant 130. At first sampling phase 136, a first output component of output signal 78 (FIG. 2) is sampled. The first output component of output signal 78 includes the desired signal, $V_{OUT1}$ of equation (10) and some amount of signal error, $V_{ERROR}$, due to DC offset and flicker error. At second sampling phase 138, a second output component of output signal 78 is sampled. However, the second output component of output signal 78 is opposite in polarity from the first output component of output signal 78. Thus, at the input of chopper 76, the second output component of output signal 78 includes the desired signal, $-V_{OUT2}$. The second output component of output signal also includes some amount of signal error, $V_{ERROR}$, due to DC offset and flicker error that is equal to the signal error found in the first output component.

As shown in diagram 126, chopper polarity is switched during second sampling phase 138. Thus, chopper 76 is configured to change the polarity of the second output component such that the first and second output components ($V_{OUT1}$ and $-V_{OUT2}$) of output signal 78 will have the same polarity (i.e., same sign). Accordingly, as demonstrated above in equation (10), swapping the polarity of the second output component and summing the first and second output components largely cancels the error signal, $V_{ERROR}$, while generally yielding the signal output, $V_O$ ($V_{OUT1}+V_{OUT2}$). The first and second output components may effectively be averaged in the analog domain, as known to those skilled in the art, to yield $V_O$ which thereafter undergoes analog to digital conversion at ADC 80 during a ADC conversion phase 140. Alternatively, ADC 80 may receive the first and second output components, digitize them, and thereafter average them in the digital domain.

Switching to the relatively high excitation voltage 38 by using a voltage doubling charge pump 102 also doubles the output signal at C2V 72 (FIG. 2) which increase the SNR with respect to the noise generated by C2V 72. That is, the relatively high excitation voltage 38 increases an effective gain at C2V 72, which allows for decreasing gain at gain stage 74, and thereby improving the resultant SNR. Further, controlling chopper circuit 76 in accordance with the relatively high excitation voltage 38 enables offset and flicker error cancellation. Thus, the signal chain of system 62 (FIG. 2) may be improved by a factor of two in SNR when excitation voltage 38 is produced by the doubling charge pump 102 (FIG. 2).

Figure 7:
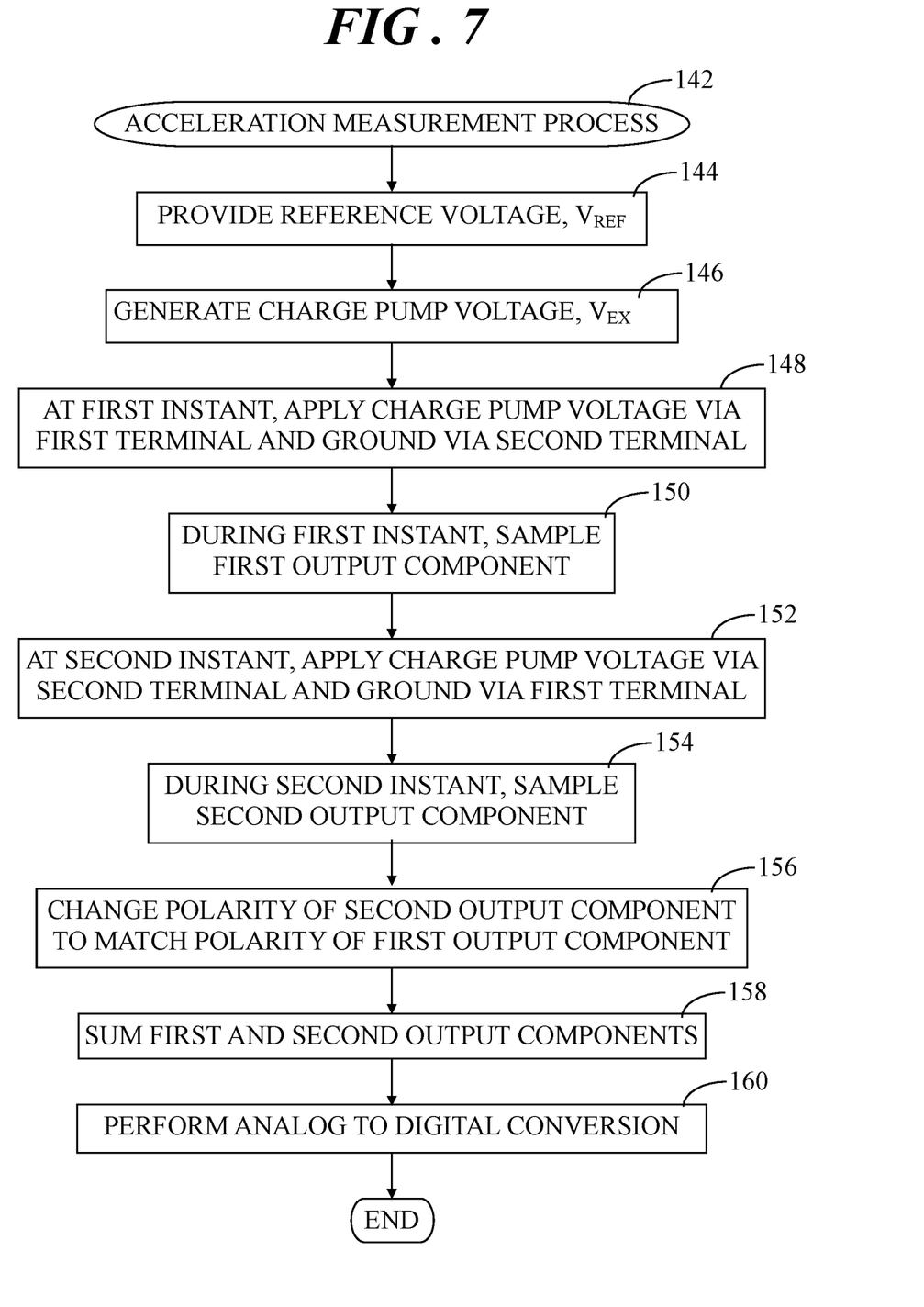
FIG. 7 shows a flowchart of an acceleration measurement process in accordance with another embodiment.

Referring now to FIGS. 2, 3, and 7, FIG. 7 shows a flowchart of an acceleration measurement process 142 in accordance with another embodiment. In general, acceleration measurement process 142 may be implemented using system 62 that includes a capacitive transducer (e.g., accelerometer 20) having capacitors 44, 50 connected to first terminal 40 and capacitors 46, 48 connected to second terminal 42. Acceleration measurement process 142 demonstrates a single measurement cycle for simplicity. It should be apparent that execution of acceleration measurement process 142 may be continuously repeated for a multiplicity of measurement cycles.

Acceleration measurement process 142 includes a number of process blocks, each of which will be described in detail below. Each process block generically illustrated in FIG. 7 may entail a single process or multiple sub-processes. Furthermore, the process blocks illustrated in FIG. 7 and described below are provided by way of non-limiting example. In alternative embodiments of acceleration measurement process 60, additional process blocks may be performed, certain process blocks may be omitted, and/or the illustrated process blocks may be performed in alternative sequences.

At a block 144, voltage source 100 receives supply voltage, $V_S$, 108 from an external supply and provides reference voltage 68, $V_{REF}$. At a block 146, voltage generator 102 receives reference voltage 68 and generates charge pump voltage 67, $V_{PUMP}$, that is greater than supply voltage 108, and preferably double, reference voltage 68.

At a block 148, at a first instant 128 (FIG. 6) in time, charge pump voltage 67 is applied to capacitors 44, 50 via first terminal 40 and system ground 70 is applied to capacitors 46, 48 via second terminal 42 to yield the differential excitation voltage 38. Charge pump voltage 67 and system ground 70 are arranged on opposite sides of and equidistant from reference voltage 68. At a block 150, a first output component, $V_{OUT1}$, of output signal 75 is sampled during the first instant in time. At a block 152, at a second instant 130 (FIG. 6) in time, charge pump voltage 67 is applied to capacitors 46, 48 via second terminal 42 and system ground 70 is applied to capacitors 44, 50 via first terminal 40 to yield the differential excitation voltage 38 that is opposite in polarity from excitation voltage applied at block 148. At a block 154, a second output component, $V_{OUT2}$, of output signal 75 is sampled during the second instant in time.

At a block 156, the polarity of the second output component is changed to match the polarity of the first output component, and at a block 158, the first and second output components are summed and/or averaged. As discussed above, summation of the first and second output components substantially cancels an error signal (DC offset and flicker error) in each of the first and second output components. At a block 160, the summed analog output signal 78, $V_O$, undergoes analog-to-digital conversation at ADC 80 to yield a digital output signal, $ADC_{OUT}$ 82 indicative of acceleration force 32 (FIG. 1).

Embodiments described herein entail an apparatus in the form of an excitation circuit, system including the excitation circuit, and methodology. An embodiment of an excitation circuit for a capacitive transducer comprises a voltage source configured to provide a first voltage in response to receipt of a supply voltage, a voltage generator coupled to the voltage source, the voltage generator being configured to receive the first voltage and produce a second voltage that is greater than the supply voltage, and a control circuit connected to the voltage source and to the voltage generator, the control circuit being configured to provide any of a system ground, the first voltage, and the second voltage to a first terminal and a second terminal of the capacitive transducer, the control circuit being configured to apply the system ground and the second voltage in the form of two consecutive stimuli with opposite polarities.

An embodiment of a system comprises a capacitive transducer, an excitation circuit electrically coupled with the capacitive transducer, the excitation circuit being configured to excite the capacitive transducer, and a measuring circuit electrically coupled with the capacitive transducer for measuring an output signal from the capacitive transducer responsive to the excitation voltage, the excitation circuit comprising a voltage source configured to provide a first voltage in response to receipt of a supply voltage, a voltage generator coupled to the voltage source, the voltage generator being configured to receive the first voltage and generate a second voltage that is greater than the supply voltage, and a control circuit connected to the voltage source and to the voltage generator, the control circuit being configured to provide any of a system ground, the first voltage, and the second voltage to a first terminal and a second terminal of the capacitive transducer, the control circuit being configured to apply the system ground and the second voltage in the form of two consecutive stimuli with opposite polarities.

An embodiment of a method for measuring acceleration using a system that includes a capacitive transducer, the capacitive transducer including a first capacitor connected to a first terminal and a second capacitor connected to a second terminal, wherein the method comprises implementing a voltage source to provide a first voltage in response to a received supply voltage and generating a second voltage that is greater than the supply voltage. The method further comprises at a first instant in time, applying the second voltage to the first capacitor via the first terminal and concurrently applying a system ground to the second capacitor via the second terminal, wherein the second voltage and the system ground are arranged on opposite sides of and equidistant from the first voltage, and during the first instant, sampling a first output component of the capacitive sensor device responsive to the second voltage. The method further comprises at a second instant in time following the first instant in time, applying the second voltage to the second capacitor and concurrently applying the system ground to the first capacitor, sampling a second output component of the capacitive sensor device responsive to the second voltage during the second instant, inverting a polarity of the second output component, and following the inverting operation, summing the first and second output components to produce an output signal indicative of the acceleration, wherein the summing substantially cancels an error signal in each of the first and second output components. In an embodiment, the generating operation comprises doubling the first voltage to produce the second voltage.

The apparatus, system, and methodology enable the production of a fully differential excitation voltage for a capacitive transducer, such as a microelectromechanical systems (MEMS) capacitive accelerometer. The apparatus, in the form of an excitation circuit, includes at least one charge pump for producing an excitation signal that is greater than a supply voltage. The excitation voltage is applied to the capacitive transducer in the form of two consecutive stimuli with opposite polarities (i.e., a double differential excitation signal). Such an excitation signal allows for the cancellation of DC offsets and flicker noise from the analog circuitry while concurrently increasing the sensitivity of the capacitive transducer. Accordingly, signal-to-noise ratio (SNR) performance of the system may be dramatically improved at modest cost in terms of die size and power.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

The invention claimed is:

1. An excitation circuit for a capacitive transducer, comprising:
 a voltage source configured to provide a first voltage in response to receipt of a supply voltage;
 a voltage generator coupled to said voltage source, said voltage generator being configured to receive said first voltage and produce a second voltage that is greater than said supply voltage; and
 a control circuit coupled to said voltage source and to said voltage generator, said control circuit being configured to provide any of a system ground, said first voltage, and said second voltage to a first terminal and a second terminal of said capacitive transducer, said control circuit being configured to apply said system ground and said second voltage to said first and second terminals in the form of two consecutive stimuli with opposite polarities, wherein:
  said second voltage is configured for electrical excitation of a capacitor of said capacitive transducer, said second voltage including a first noise contribution that increases as a magnitude of said second voltage increases;
  said capacitive transducer is coupled to a first stage of a measuring circuit, said first stage imposing a second noise contribution onto an output signal from said capacitive transducer, said second noise contribution decreasing as said second voltage increases; and
  said second voltage is configured to be a value at which said first noise contribution is approximately equivalent to said second noise contribution.

2. The excitation circuit of claim 1, wherein said voltage source comprises a voltage regulator configured to receive said supply voltage and output said first voltage that is no greater than said supply voltage.

3. The excitation circuit of claim 1 wherein said voltage source comprises a charge pump configured to receive said supply voltage and output said first voltage, a value of said first voltage being greater than said supply voltage.

4. The excitation circuit of claim 1, wherein said voltage generator comprises a voltage doubler configured to generate said second voltage by doubling said first voltage.

5. The excitation circuit of claim 1 wherein said voltage generator comprises a charge pump configured to output said second voltage.

6. The excitation circuit of claim 1, wherein:
 said control circuit is configured to apply said second voltage as a first stimulus of said two consecutive stimuli to a first capacitor of said capacitive transducer via said first terminal of said capacitive transducer at a first instant in time; and
 said control circuit is further configured to apply said second voltage as a second stimulus of said two consecutive stimuli to a second capacitor of said capacitive transducer via said second terminal at a second instant in time, said second instant following said first instant.

7. The excitation circuit of claim 6 wherein said control circuit is further configured to apply said system ground to said second capacitor via said second terminal while said second voltage is applied to said first capacitor and to apply said system ground to said first capacitor via said first terminal while said second voltage is applied to said second capacitor.

8. The excitation circuit of claim 1 wherein said second voltage and said system ground are arranged on opposite sides of and located equidistant from said first voltage.

9. The excitation circuit of claim 1 wherein said capacitive transducer comprises an accelerometer.

10. A system comprising;
 a capacitive transducer;
 an excitation circuit electrically coupled with said capacitive transducer, said excitation circuit being configured to excite said capacitive transducer, said excitation circuit comprising:
  a voltage source configured to provide a first voltage in response to receipt of a supply voltage;
  a voltage generator coupled to said voltage source, said voltage generator being configured to receive said first voltage and generate a second voltage that is greater than said supply voltage; and
  a control circuit coupled to said voltage source and to said voltage generator, said control circuit being configured to provide any of a system ground, said first voltage, and said second voltage to a first terminal and second terminal of said capacitive transducer, said control circuit being configured to apply said system ground and said second voltage to said first and second terminals in the form of two consecutive stimuli with opposite polarities; and a measuring circuit electrically coupled with said capacitive transducer for measuring an output signal from said capacitive transducer responsive to said second voltage, wherein:

said second voltage is configured for electrical excitation of a capacitor of said capacitive transducer, said second voltage including a first noise contribution that increases as a magnitude of said second voltage increases;

said capacitive transducer is coupled to a first stage of a measuring circuit, said first stage imposing a second noise contribution onto said output signal from said capacitive transducer, said second noise contribution decreasing as said magnitude of said second voltage increases; and said second voltage is configured to be a value at which said first noise contribution is approximately equivalent to said second noise contribution.

11. The system of claim 10 wherein:

said voltage source comprises a voltage regulator configured to receive a supply voltage and output said first voltage that is no greater than said supply voltage; and said voltage generator comprises a charge pump configured to generate said second voltage by doubling said first voltage.

12. The system of claim 10 wherein:

said voltage source comprises a first charge pump configured to receive a supply voltage and output said first voltage, a value of said first voltage being greater than said supply voltage; and said voltage generator comprises a second charge pump configured to generate said second voltage by doubling said first voltage.

13. A system comprising;

a capacitive transducer;

an excitation circuit electrically coupled with said capacitive transducer, said excitation circuit being configured to excite said capacitive transducer, said excitation circuit comprising:

a voltage source configured to provide a first voltage in response to receipt of a supply voltage;

a voltage generator coupled to said voltage source, said voltage generator being configured to receive said first voltage and generate a second voltage that is greater than said supply voltage; and a control circuit coupled to said voltage source and to said voltage generator, said control circuit being configured to provide any of a system ground, said first voltage, and said second voltage to a first terminal and second terminal of said capacitive transducer, wherein:

said control circuit is configured to apply said system ground and said second voltage to said first and second terminals in the form of two consecutive stimuli with opposite polarities;

said control circuit is configured to apply said second voltage as a first stimulus of said two consecutive stimuli to a first capacitor connected to said first terminal of said capacitive transducer at a first instant in time and to apply said system ground to a second capacitor connected to said second terminal while said second voltage is applied to said first capacitor; and said control circuit is configured to apply said second voltage as a second stimulus of said two consecutive stimuli to said second capacitor via said second terminal at a second instant in time and to apply said system ground to said first capacitor via said first terminal while said second voltage is applied to said second capacitor, said second instant following said first instant; and a measuring circuit electrically coupled with said capacitive transducer for measuring an output signal from said capacitive transducer responsive to said second voltage.

14. The system of claim 13 wherein said measuring circuit is configured to sample a first output component of said output signal during said first instant and to sample a second output component of said output signal during said second instant, said second output component being opposite in polarity from said first output component.

15. The system of claim 14 wherein said measuring circuit is configured to invert said polarity of said second output component, and wherein after inverting said polarity of said second output component, said measuring circuit is further configured to sum said first and second output components, wherein summation of said first and second output components of said output signal substantially cancels an error signal in each of said first and second output components.

* * * * *